(12) United States Patent
Chen et al.

(10) Patent No.: US 9,753,505 B2
(45) Date of Patent: Sep. 5, 2017

(54) EXPANSION CARD SECURING DEVICE AND HOUSING

(71) Applicant: PEGATRON CORPORATION, Taipei (TW)

(72) Inventors: Ying-De Chen, Taipei (TW); Wei-Min Lou, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 15/210,880

(22) Filed: Jul. 14, 2016

(65) Prior Publication Data
US 2017/0060196 A1 Mar. 2, 2017

(30) Foreign Application Priority Data
Aug. 28, 2015 (TW) .............................. 104128321 A (51) Int. Cl.
*G06F 1/18* (2006.01)
*H05K 7/14* (2006.01)

(52) U.S. Cl.
CPC .............. *G06F 1/186* (2013.01); *G06F 1/181* (2013.01); *G06F 1/185* (2013.01); *H05K 7/1408* (2013.01)

(58) Field of Classification Search
CPC ......... G06F 1/181; G06F 1/183–1/186; H05K 7/1408; H05K 7/1409; H05K 7/1401; H05K 7/1402; H05K 7/1405; H05K 7/1417
See application file for complete search history.

(56) References Cited

U.S. PATENT DOCUMENTS

| | | | | |
|---|---|---|---|---|
| 7,120,032 B2* | 10/2006 | Lin | ........................ | G06F 1/186 |
| | | | | 361/679.32 |
| 7,265,997 B2* | 9/2007 | Jing | ........................ | G06F 1/184 |
| | | | | 312/223.2 |
| 7,283,376 B2* | 10/2007 | Han | ...................... | H05K 7/1418 |
| | | | | 312/223.2 |
| 7,388,759 B2* | 6/2008 | Chen | ....................... | G06F 1/186 |
| | | | | 361/801 |
| 7,576,999 B2* | 8/2009 | Tang | ....................... | G06F 1/186 |
| | | | | 312/223.2 |

(Continued)

*Primary Examiner* — Dimary Lopez Cruz
*Assistant Examiner* — Abhishek Rathod
(74) *Attorney, Agent, or Firm* — Winston Hsu (57) ABSTRACT

An expansion card securing device comprises a frame, a securing member, an elastic member, a pivot and an operating member. The frame has a first engaging portion and a second engaging portion. The securing member has a shaft portion and a securing portion. The securing portion is connected with the shaft portion. The shaft portion has two salient portions protruding from the securing portion. The shaft portion is pivotally connected with the frame via the two salient portions. The securing portion is engaged with the first engaging portion. The elastic member is sleeved at the salient portion closer to the second engaging portion. Two ends of the elastic member abut the securing portion and the frame, respectively. The operating member has a rotating portion and an operating portion. The operating portion is connected with the rotating portion and is engaged with the second engaging portion. The rotating portion is pivotally connected with the salient portion closer to the second engaging portion via the pivot and abuts the side wall having the second engaging portion of the frame.

19 Claims, 6 Drawing Sheets

(56) References Cited

U.S. PATENT DOCUMENTS

| | | | | |
|---|---|---|---|---|
| 7,593,237 B2* | 9/2009 | Tang | ............... | G06F 1/186 |
| | | | | 312/223.2 |
| 7,826,211 B2* | 11/2010 | Liu | ............... | G06F 1/186 |
| | | | | 312/223.1 |
| 7,855,898 B2* | 12/2010 | Tang | ............... | G06F 1/186 |
| | | | | 361/801 |
| 7,916,476 B2* | 3/2011 | Hsu | ............... | G06F 1/186 |
| | | | | 211/41.17 |
| 8,203,852 B2* | 6/2012 | Wang | ............... | G06F 1/186 |
| | | | | 361/732 |
| 8,325,492 B2* | 12/2012 | Cheng | ............... | G06F 1/186 |
| | | | | 361/801 |
| 8,382,215 B2* | 2/2013 | Chen | ............... | G06F 1/186 |
| | | | | 312/223.2 |
| 9,049,785 B2* | 6/2015 | Yu | ............... | H05K 5/0282 |
| 9,098,253 B2* | 8/2015 | Wu | ............... | G06F 1/186 |
| 2004/0174687 A1* | 9/2004 | Wang | ............... | G06F 1/186 |
| | | | | 361/801 |
| 2007/0242442 A1* | 10/2007 | Dai | ............... | H05K 7/1408 |
| | | | | 361/801 |
| 2009/0168375 A1 | 7/2009 | Tang | | |

* cited by examiner

EXPANSION CARD SECURING DEVICE AND HOUSING

CROSS-REFERENCE TO RELATED APPLICATIONS

This application claims the priority benefits of Taiwan Patent Application No. 104128321, filed on Aug. 28, 2015. The entirety of the above-mentioned patent applications are hereby incorporated by references herein and made a part of specification.

BACKGROUND

Technology Field

The disclosure relates to an expansion card securing device and a housing thereof and, in particular, to an expansion card securing device which has good securing strength and is easy to operate and a housing with such expansion card securing device.

Related Art

With the development and progress of science and technology, the computer has become a necessity indispensable in people's daily lives. To fulfill varieties of functional requirements, the motherboard of a computer often has multiple expansion slots to install expansion cards such as a sound card, a graphic acceleration card or an Ethernet card to add additional functions. In the prior art, an expansion card is secured to the housing of the computer by a signal or multiple hooks. However, the hooks could be loosen or fall off easily when the computer is being moved or shocked accidentally, which results in the loose, shake or even fall off of the expansion card and further the damage of the expansion card or the motherboard installed with the expansion card. In the prior art, the expansion card could be also secured by a screw. However, it is inconvenient to secure the expansion card by a screw. The expansion card cannot be uninstalled if the user cannot find a suitable screwdriver.

SUMMARY

One objective of the invention is to provide an expansion card securing device with good securing strength and is easy to operate, and a housing installed with such expansion card securing device.

In one embodiment, the expansion card securing device includes a frame, a securing member, an elastic member, a pivot and an operating member. The frame has a first engaging portion and a second engaging portion, wherein the first engaging portion and the second engaging portion are located at two side walls of the frame. The securing member has a shaft portion and a securing portion. The securing portion is connected with the shaft portion. The shaft portion has two salient portions protruding from the securing portion. The shaft portion is pivotally connected with the frame via the two salient portions. The securing portion is engaged with the first engaging portion to secure a plurality of expansion cards. The elastic member is sleeved at the salient portion closer to the second engaging portion. Two ends of the elastic member abut the securing portion and the side wall of the frame having the second engaging portion, respectively. The operating member has a rotating portion and an operating portion. The operating portion is connected with the rotating portion and is engaged with the second engaging portion. The rotating portion is pivotally connected with the salient portion closer to the second engaging portion via the pivot and abuts the side wall of the frame having the second engaging portion. When the operating portion is disengaged from the second engaging portion, the rotating portion is capable of eccentrically rotating with the pivot as the rotation axis to drive the shaft portion and the securing portion to move toward a direction away from the first engaging portion, causing the securing portion to disengage from the first engaging and compress the elastic member, whereby the rotation portion is capable of rotating with the shaft portion as the rotation axis to drive the securing portion connected with the shaft portion to rotate to release the expansion cards.

In another embodiment, the housing of the invention includes an expansion card securing device. The expansion card securing device includes a frame, a securing member, an elastic member, a pivot, an operating member and a plurality of securing slots. The frame has a first engaging portion and a second engaging portion, wherein the first engaging portion and the second engaging portion are located at two side walls of the frame. The securing member has a shaft portion and a securing portion. The securing portion is connected with the shaft portion. The shaft portion has two salient portions protruding from the securing portion. The shaft portion is pivotally connected with the frame via the two salient portions. The securing portion is engaged with the first engaging portion to secure a plurality of expansion cards. The elastic member is sleeved at the salient portion closer to the second engaging portion, and the two ends of the elastic member abut the securing portion and the side wall of the frame having the second engaging portion, respectively. The operating member has a rotating portion and an operating portion. The operating portion is connected with the rotating portion and is engaged with the second engaging portion. The rotating portion is pivotally connected with the salient portion closer to the second engaging portion via the pivot and abuts the side wall of the frame having the second engaging portion. When the operating portion is disengaged from the second engaging portion, the rotating portion is capable of eccentrically rotating with the pivot as the rotation axis to drive the shaft portion and the securing portion to move toward a direction away from the first engaging portion, causing the securing portion to disengage from the first engaging and compress the elastic member, whereby the rotation portion is capable of rotating with the shaft portion as the rotation axis to drive the securing portion connected with the shaft portion to rotate to release the expansion cards. The plurality of securing slots are provided between the first engaging portion and the second engaging portion, and the expansion cards are secured at the securing slots, respectively.

To sum up, when the expansion card securing device according to the invention secures the expansion cards at the frame, the securing portion of the securing member and the operating portion of the operating member are engaged with the first engaging portion and the second engaging portion of the two side walls of the frame, respectively, so that the securing member cannot rotate with respect to the frame. Therefore, the expansion card securing device of the invention provides good securing strength and ensures that the expansion cards do not be loosed or fall off. When a user wants to uninstall an expansion card, he or she can disengage the operating portion of the operating member from the second engaging portion, so that the rotating portion of the operating member is capable of eccentrically rotating with the pivot as the rotation axis to drive the shaft portion and the securing portion of the securing member to move toward a direction away from the first engaging portion, causing the securing portion of the securing member to disengage from the first engaging portion. Whereby, the rotating portion of the operating member is capable of rotating with the shaft portion of the securing member as the rotation axis to drive the securing portion connected with the shaft portion to rotate to release the expansion cards. Therefore, the user can to uninstall an expansion card quickly without any tool, which operation is very convenient.

The advantage and spirit of the invention will become more fully understood from the detailed description and accompanying drawings.

DETAILED DESCRIPTION OF THE EMBODIMENT

Figure 1:
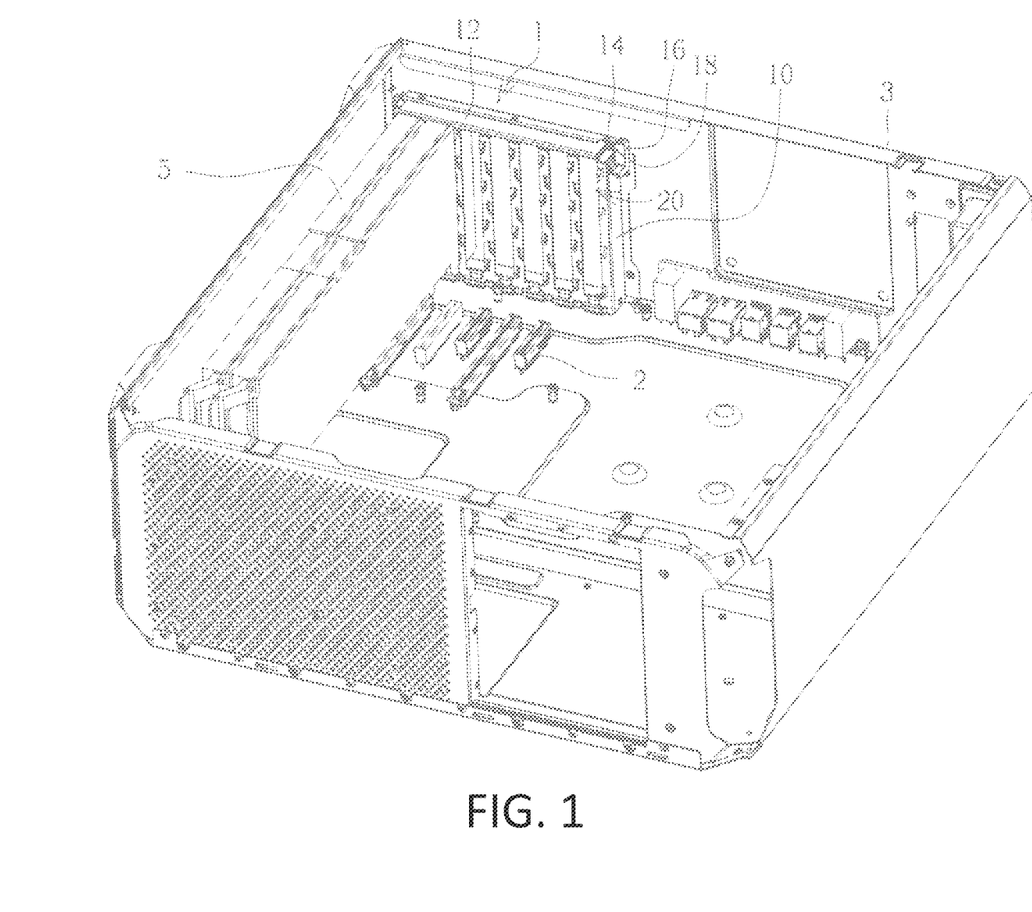
FIG. 1 is a perspective diagram of an expansion card securing device disposed in a housing according to an embodiment of the invention.
Figure 2:
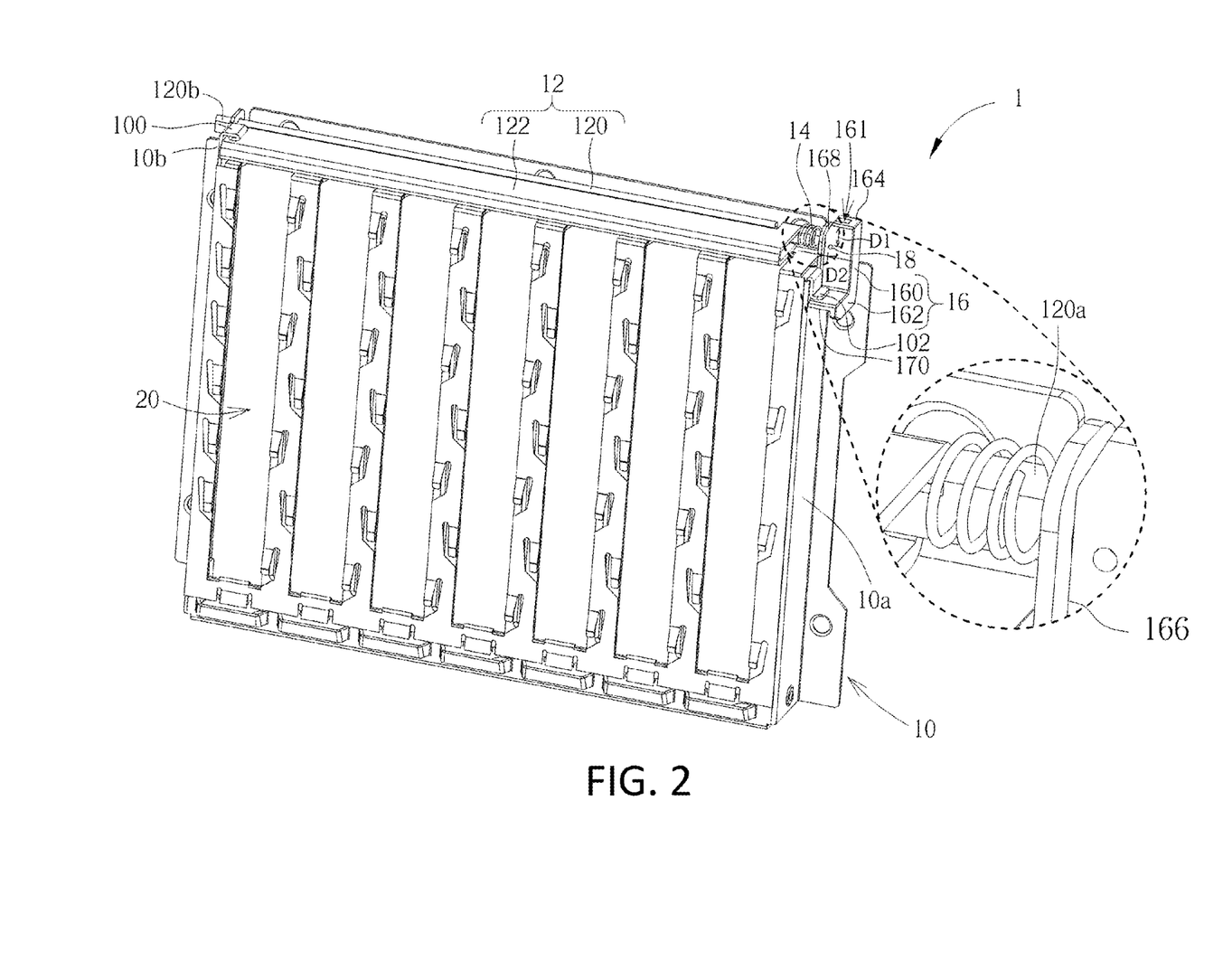
FIG. 2 is a perspective diagram of the expansion card securing device shown in FIG. 1.
Figure 3:
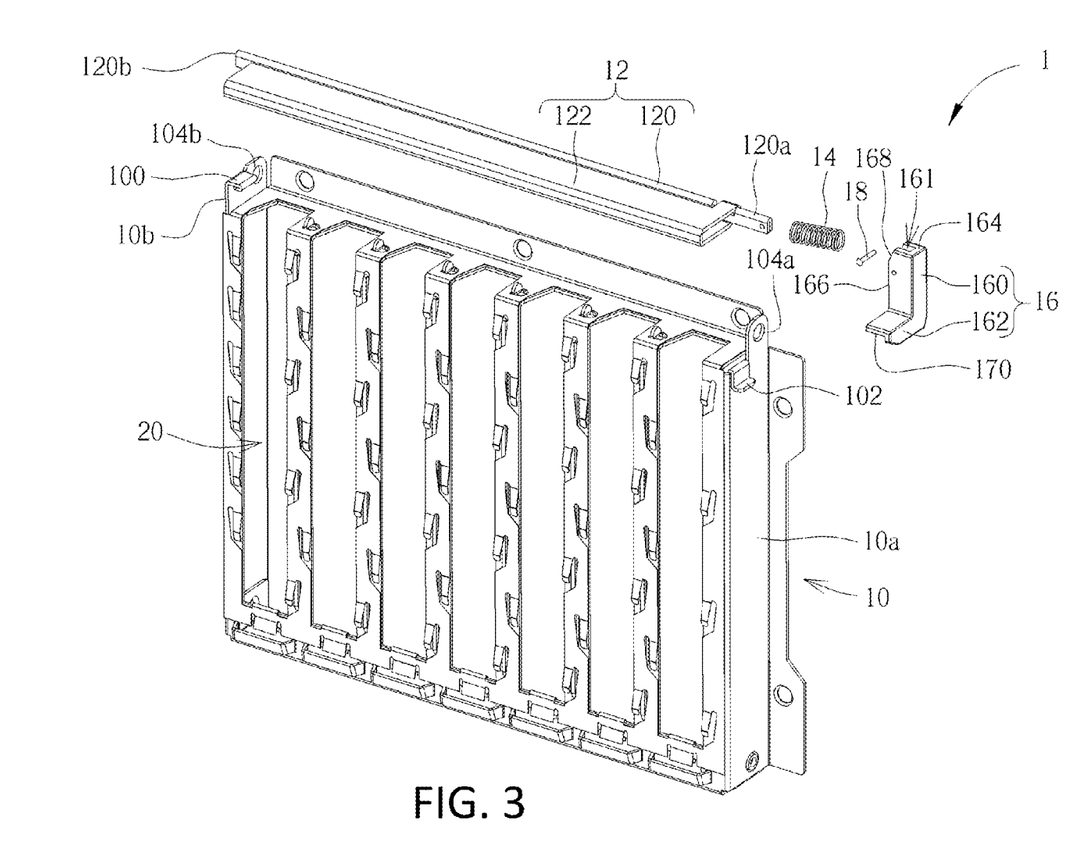
FIG. 3 is an exploded diagram of the expansion card securing device shown in FIG. 2.
Figure 4:
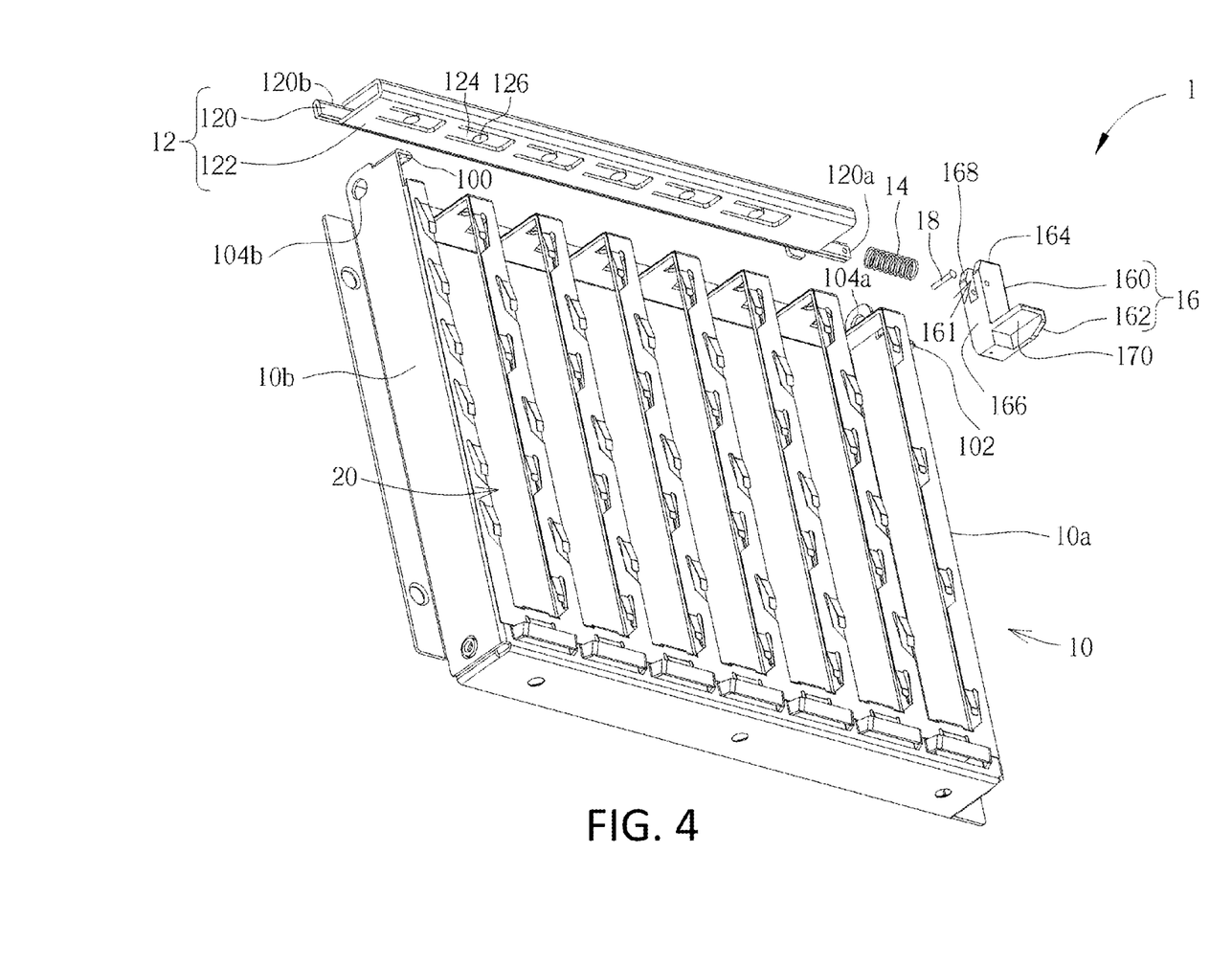
FIG. 4 is an exploded diagram of the expansion card securing device shown in FIG. 2 in another view angle.
Figure 5:
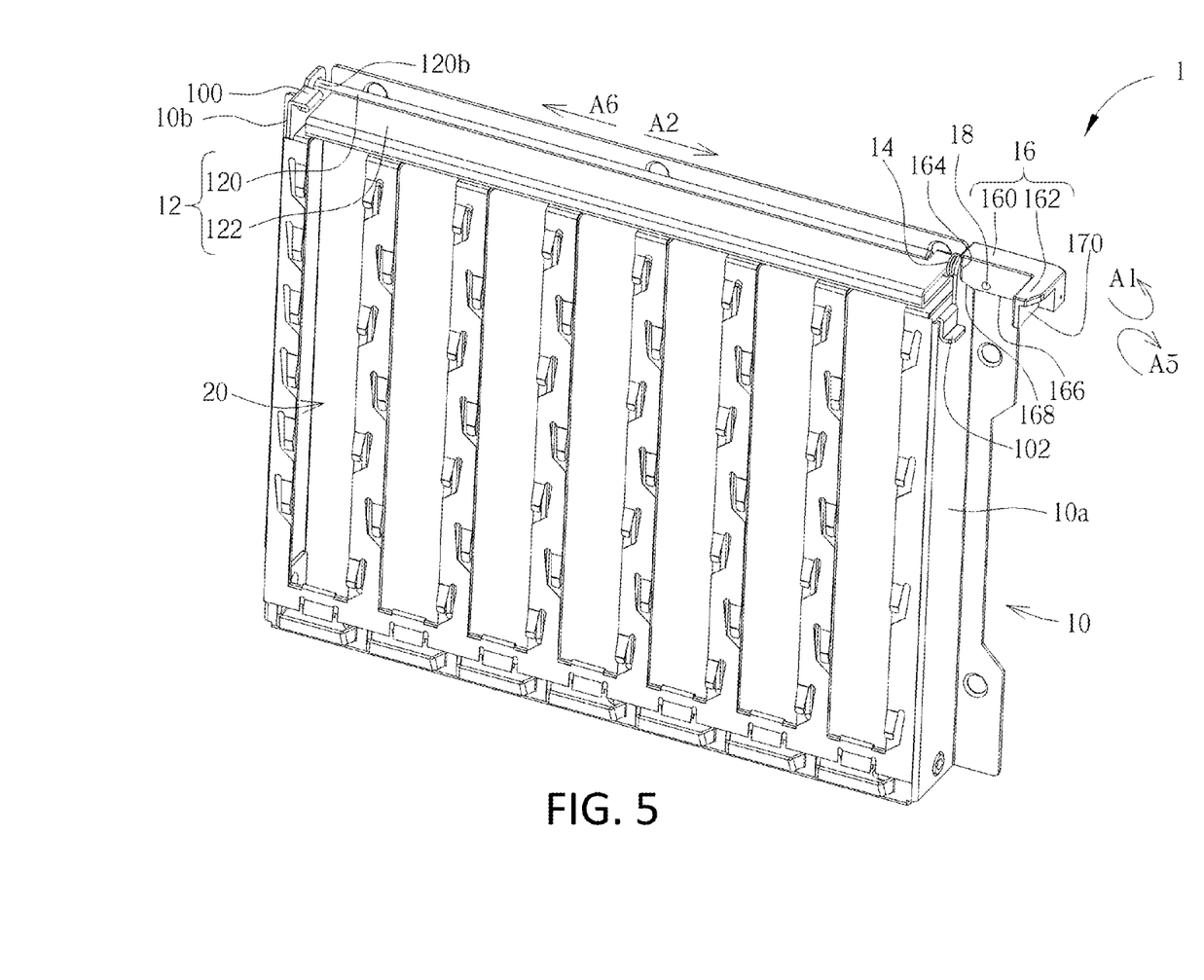
FIG. 5 is a perspective diagram of the operating portion of the operating member shown in FIG. 2 disengaged from the second engaging portion.
Figure 6:
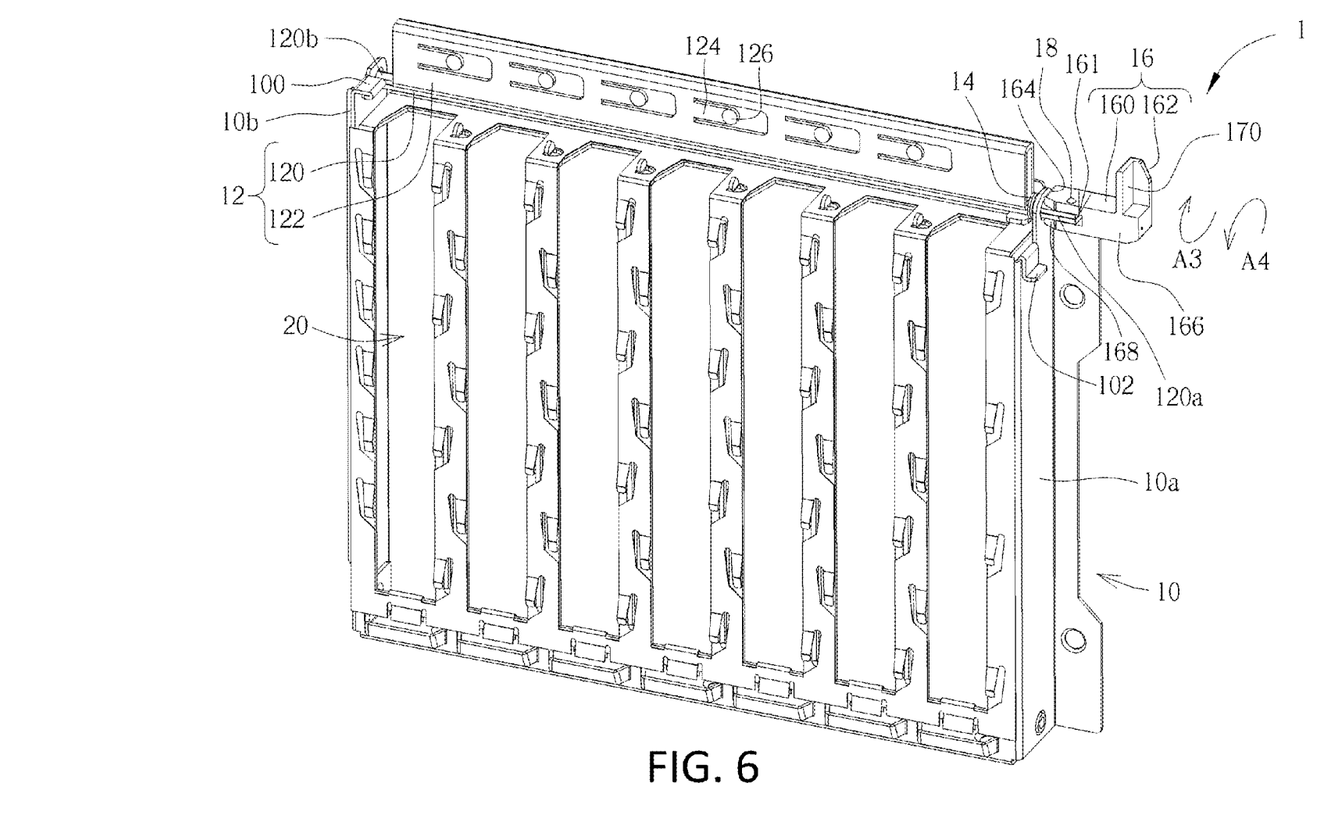
FIG. 6 is a perspective diagram of the rotating portion of the operating member after rotated with the shaft portion as the rotation axis.

Please refer to FIG. 1 to FIG. 6. FIG. 1 is a perspective diagram of an expansion card securing device 1 disposed in the housing 3 according to an embodiment of the invention. FIG. 2 is a perspective diagram of the expansion card securing device 1 shown in FIG. 1. FIG. 3 is an exploded diagram of the expansion card securing device 1 shown in FIG. 2. FIG. 4 is an exploded diagram of the expansion card securing device 1 shown in FIG. 2 in another view angle. FIG. 5 is a perspective diagram of the operating portion 162 of the operating member 16 shown in FIG. 2 disengaged from the second engaging portion 102. FIG. 6 is a perspective diagram of the rotating portion 160 of the operating member 16 after rotated with the shaft portion 120 as the rotation axis.

As shown in FIG. 1, the housing 3 includes the expansion card securing device 1 and a plurality of expansion slots 2, wherein the expansion card securing device 1 and the expansion slots 2 are disposed in the housing 3. The expansion cards 5 can be inserted at corresponding expansion slots 2, and the expansion card securing device 1 is used to secure the expansion cards 5. In practical applications, the housing 3 can be the housing of a computer main unit, and the expansion cards may be a sound card, a graphic acceleration card, an Ethernet card or other expansion card.

As shown in FIG. 2 to FIG. 6, the expansion card securing device 1 includes a frame 10, a securing member 12, an elastic member 14, an operating member 16, a pivot 18 and a plurality of securing slots 20. The frame 10 has a first engaging portion 100 and a second engaging portion 102, wherein the first engaging portion 100 and the second engaging portion 102 are located at two side walls 10a, 10b of the frame 10. The securing slots 20 are provided between the first engaging portion 100 and the second engaging portion 102. In the present embodiment, the positions of the expansion slots 2 correspond to the positions of the securing slots 20, so that the expansion cards 5 can be inserted at corresponding expansion slots 2, respectively, and be secured by the securing slots 20 corresponding to the expansion slots 2. The securing member 12 has a shaft portion 120 and a securing portion 122, wherein the securing portion 122 is connected with the shaft portion. The shaft portion 120 has two salient portions 120a, 120b protruded from the securing portion 122. The shaft portion 120 is pivotally connected at two side walls 10a, 10b of the frame 10 via the two salient portions 120a, 120b. The securing portion 122 is engaged with the first engaging portion 100 to secure the expansion cards 5. The elastic member 14 is sleeved at the salient portion 120a closer to the second engaging portion 102, and two ends of the elastic member 14 abut the securing portion 122 and the side wall 10a of the frame 10 having the second engaging portion 102, respectively, wherein the elastic member can be a spring, but is not limited thereto. The operating member 16 has a rotating portion 160 and an operating portion 162. The operating portion 162 is connected with the rotating portion 160 and is engaged with the second engaging portion 102. In the present embodiment, the rotating portion 160 and the operating portion 162 are L-shaped, but are not limited thereto. The rotating portion 160 is pivotally connected with the salient portion 120a closer to the second engaging portion 102 via the pivot 18 and abut the side wall 10a of the frame 10 having the second engaging portion 102. Moreover, the rotating portion 160 has an accommodation slot 161.

In the present embodiment, the two side walls 10a, 10b of the frame 10 have two holes 104a, 104b. During the assembly process, the elastic member 14 can be sleeved at the salient portion 120a of the shaft portion 120 of the securing member 12 closer to the side wall 10a first, and then the two salient portions 120a, 120b of the shaft portion 120 can be disposed through the two holes 104a, 104b of the two side walls 10a, 10b of the frame 10, so that the two ends of the elastic member 14 abut the securing portion 122 of the securing member 12 and the side wall 10a of the frame 10 having the second engaging portion 102, respectively. Afterward, the salient portion 120a disposed through the side wall 10a is inserted into the accommodation slot 161 of the rotating portion 160, and the pivot 18 is inserted into the rotating portion 160 and the salient portion 120a of the shaft portion 120, so that the operating member 16 can drive the shaft portion 120, whereby the shaft portion 120 can move and rotate. Furthermore, the accommodation slot 161 accommodates a portion of the salient portion 120a disposed through the side wall 10a and closer to the second engaging portion 102, suitable for the pivot 18 to be pivotally connected with the rotation portion 160 and the portion of the salient portion 120a within the accommodation slot 161 and closer to the second engaging portion 102. Moreover, after assembled, the operating member 16 and the elastic member 14 are located at opposite sides of the side wall 10a of the frame 10 having the second engaging portion 102, respectively.

As shown in FIG. 1 and FIG. 2, when the expansion card securing device 1 secures the expansion card 5 at the frame 10, the securing portion 122 of the securing member 12 is engaged with the first engaging portion 100 of the frame 10, and the operating portion 162 of the operating member 16 is engaged with the second engaging portion 102, so that the securing member 12 cannot rotate with respect to the frame 10. In other words, when the securing portion 122 of the securing member 12 is engaged with the first engaging portion 100, the securing portion 122 secures one end of each expansion card 5 at the securing slot 20 corresponding to the expansion slot 2. At this moment, the elastic member 14 can provide elastic force to push the securing portion 122 of the securing member 12, so that the securing member 12 cannot move with respect to the frame 10. Therefore, the expansion card securing device 1 can provide a good securing strength to ensure that the expansion cards would not be loosen or fall off.

As shown in FIG. 4, the securing portion 122 of the securing member 12 may have a plurality of elastic arms 124, and the positions of the elastic arms 124 correspond to the positions of the securing slots 20. Each elastic arm 124 includes a projection 126, wherein the projection 126 projects from the elastic arm 124 toward the expansion slot 2. When the securing member 12 is at the securing state as shown in FIG. 1 and FIG. 2, that is, when the securing portion 122 of the securing member 12 is engaged with the first engaging portion 100, the projection 126 causes the corresponding expansion card 5 to generate preload interference to enhance the securing strength to the expansion card 5.

In the present embodiment, the rotating portion 160 of the operating member 16 has a pushing surface 164, an abutment surface 166 and a slant surface 168, wherein the slant surface 168 is connected with the pushing surface 164 and the abutment surface 166. As shown in FIG. 2, when the operating portion 162 of the operating member 16 is engaged with that second engaging portion 102 of the frame 10, the abutment surface 166 abuts the side wall 10a of the frame 10. Moreover, the distance D1 between the pushing surface 164 and the pivot 18 is greater than the distance D2 between the abutment surface 166 and the pivot 18. Moreover, the operating portion 162 of the operating member 16 has a concave portion 170.

When a user wants to uninstall an the expansion card 5, he or she can pull the concave portion 170 of the operating portion 162 of the operating member 16 by a finger, causing the operating portion 162 to move toward a direction away from the second engaging portion 102 (the direction of the arrow A1 shown in FIG. 5) and further disengage from the second engaging portion 102 of the frame 10. When the operating portion 162 is disengaged from the second engaging portion 102 of the frame 10, the rotating portion 160 is capable of eccentrically rotating with the pivot 18 as the rotation axis to drive the shaft portion 120 and the securing portion 122 of the securing member 12 to move toward a direction away from the first engaging portion 100 (the direction of the arrow A2 shown in FIG. 5), causing the securing portion 122 to disengage from the first engaging portion 100 and compress the elastic member 14, whereby the rotation portion 160 of the operating member 16 is capable of rotating with the shaft portion 120 of the securing member 12 as the rotation axis to drive the securing portion 122 connected with the shaft portion 120 to rotate to release the expansion card 5. Furthermore, when the operating portion 162 of the operating member 16 is disengaged from the second engaging portion 102, the abutment surface 166 of the rotating portion 160 moves away from the side wall 10a of the frame 10, causing the pushing surface 164 to push the side wall 10a of the frame 10. Since the distance D1 between the pushing surface 164 and the pivot 18 is greater than the distance D2 between the abutment surface 166 and the pivot 18, the rotating portion 160 is capable of eccentrically rotating with the pivot 18 as the rotation axis to drive the shaft portion 120 and the securing portion 122 of the securing member 12 to move toward a direction away from the first engaging portion 100 (the direction of the arrow A2 shown in FIG. 5), causing the securing portion 122 of the securing member 12 to disengage from the first engaging portion 100 and compress the elastic member 14. Moreover, when the operating portion 162 of the operating member 16 is disengaged from the second engaging portion 102 and the rotating portion 160 of the operating member 16 rotates with the pivot 18 as the rotation axis, the abutment surface 166, the slant surface 168 and the pushing surface 164 of the rotating portion 160 abut the side wall 10a of the frame 10 in sequence, so that the movement of the operating portion 162 of the operating member 16 is smoother when disengaging from the second engaging portion 102.

When the operating portion 162 of the operating member 16 disengages from the second engaging portion 102 of the frame 10 and the securing portion 122 of the securing member 12 disengages from the first engaging portion 100 of the frame 10, the user can further rotate the operating portion 162 of the operating member 16 toward the direction of the arrow A3 shown in FIG. 6. At this moment, the operating member 16 drives the securing member 16 to rotate with the shaft portion 120 as the rotation axis toward the direction of the arrow A3 shown in FIG. 6 to release the expansion card 5. Due to the elastic force generated by the compressed elastic member 14, the securing member 16 can be rotated and maintained at any angle without free falling.

After uninstalled the expansion card, the user can rotate the operating portion 162 of the operating member 16 toward the direction of the arrow A4 shown in FIG. 6, so that the operating member 16 and the securing member 12 are restored to the status shown in FIG. 5. Afterward, operating portion 162 of the operating member 16 is moved toward the direction approaching the second engaging portion 102 (the direction of the arrow A5 shown in FIG. 5). When the operating portion 162 of the operating member 16 moves toward the direction approaching the second engaging portion 102, the rotating portion 160 of the operating member 16 can eccentrically rotate with the pivot 18 as the rotation axis to drive the shaft portion 120 and the securing portion 122 of the securing member 12 to move toward the direction approaching the first engaging portion 100 (the direction of the arrow A6 shown in FIG. 5) and the elastic member 13 is released to generate a restoring force. The restoring force is applied to the securing portion 122, whereby the shaft portion 1200 and the securing portion 122 move faster toward the direction approaching the first engaging portion 100, so that the securing portion 122 of the securing member 12 is engaged with the first engaging portion 100 to secure the expansion card 5, and make the operating portion 162 of the operating member 16 engage with the second engaging portion 102 of the frame 10. Therefore, the user can uninstall the expansion card 5 quickly without any tool, which operation is quite convenient.

To sum up, when the expansion card securing device according to the invention secures the expansion cards at the frame, the securing portion of the securing member and the operating portion of the operating member are engaged with the first engaging portion and the second engaging portion of the two side walls of the frame, respectively, so that the securing member cannot rotate with respect to the frame. Therefore, the expansion card securing device of the invention provides good securing strength and ensures that the expansion cards do not be loosen or fall off. When a user wants to uninstall an expansion card, he or she can disengage the operating portion of the operating member from the second engaging portion, so that the rotating portion of the operating member is capable of eccentrically rotating with the pivot as the rotation axis to drive the shaft portion and the securing portion of the securing member to move toward a direction away from the first engaging portion, causing the securing portion of the securing member to disengage from the first engaging portion. Whereby, the rotating portion of the operating member is capable of rotating with the shaft portion of the securing member as the rotation axis to drive the securing portion connected with the shaft portion to rotate to release the expansion cards. Therefore, the user can to uninstall an expansion card quickly without any tool, which operation is very convenient.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An expansion card securing device, comprising:
   a frame having a first engaging portion and a second engaging portion, wherein the first engaging portion and the second engaging portion are respectively located at two side walls of the frame;
   a securing member having a shaft portion and a securing portion, wherein the securing portion is connected with the shaft portion, the shaft portion has two salient portions protruding from the securing portion, the shaft portion is pivotally connected with the frame via the two salient portions, the securing portion is engaged with the first engaging portion to secure a plurality of expansion cards;
   an elastic member sleeved at the salient portion closer to the second engaging portion, wherein two ends of the elastic member abut the securing portion and the side wall having the second engaging portion of the frame, respectively;
   a pivot; and
   an operating member having a rotating portion and an operating portion, wherein the operating portion is connected with the rotating portion and engaged with the second engaging portion, the rotating portion is pivotally connected with the salient portion closer to the second engaging portion via the pivot and abuts the side wall having the second engaging portion of the frame, when the operating portion is disengaged from the second engaging portion, the rotating portion is capable of eccentrically rotating with the pivot as the rotation axis to drive the shaft portion and the securing portion to move toward a direction away from the first engaging portion, so that the securing portion disengage from the first engaging portion and compresses the elastic member, whereby the rotation portion is capable of rotating with the shaft portion as the rotation axis to drive the securing portion connected with the shaft portion to rotate to release the expansion cards.

2. The expansion card securing device according to claim 1, wherein the securing portion has a plurality of elastic arms, and each of the elastic arms comprises a projection.

3. The expansion card securing device according to claim 1, wherein the rotating portion and the operating portion are L-shaped.

4. The expansion card securing device according to claim 1, wherein the rotating portion has a pushing surface and an abutment surface, when the operating portion is engaged with the second engaging portion, the abutment surface abuts the frame, when the operating portion is disengaged from the second engaging portion, the abutment surface moves away from the frame, so that the pushing surface pushes the frame, whereby the rotating portion is capable of eccentrically rotating with the pivot as the rotation axis to drive the shaft portion and the securing portion to move toward a direction away from the first engaging portion.

5. The expansion card securing device according to claim 4, wherein the distance between the pushing surface and pivot is greater than the distance between the abutment surface and the pivot.

6. The expansion card securing device according to claim 5, wherein the rotating portion has a slant surface, the slant surface is connected with the pushing surface and the abutment surface, when the operating portion is engaged with the second engaging portion, the abutment surface abuts the frame, when the operating portion is disengaged from the second engaging portion and the rotating portion eccentrically rotates with the pivot as the rotation axis, the abutment surface, the slant surface and the pushing surface abuts the frame in sequence, so that the operating portion disengages from the second engaging portion.

7. The expansion card securing device according to claim 5, wherein the rotating portion has an accommodation slot, and the accommodation slot accommodates a portion of the salient portion closer to the second engaging portion, suitable for the pivot to be pivotally connected with the rotation portion and the portion of the salient portion closer to the second engaging portion within the accommodation slot.

8. The expansion card securing device according to claim 5, wherein when the operating portion moves toward the direction of approaching the second engaging portion, the rotating portion is capable of eccentrically rotating with the pivot as the rotation axis to drive the shaft portion and the securing portion to move toward a direction approaching the first engaging portion and the elastic member to be released to generate a restoring force, so that the securing portion engages at the first engaging portion to secure the expansion cards, and the operating portion engages at the second engaging portion.

9. The expansion card securing device according to claim 1, wherein the operating member and the elastic member are respectively located at two opposite sides of the side wall having the second engaging portion of the frame.

10. A housing, comprising:
    an expansion card securing device,
       a frame having a first engaging portion and a second engaging portion, wherein the first engaging portion and the second engaging portion are respectively located at two side walls of the frame;
       a securing member having a shaft portion and a securing portion, wherein the securing portion is connected with the shaft portion, the shaft portion has two salient portions protruding from the securing portion, the shaft portion is pivotally connected with the frame via the two salient portions, the securing portion is engaged with the first engaging portion to secure a plurality of expansion cards;
       an elastic member sleeved at the salient portion closer to the second engaging portion, wherein two ends of the elastic member abut the securing portion and the side wall having the second engaging portion of the frame, respectively;
       a pivot;
       an operating member having a rotating portion and an operating portion, wherein the operating portion is connected with the rotating portion and engaged with the second engaging portion, the rotating portion is pivotally connected with the salient portion closer to the second engaging portion via the pivot and abutting the side wall having the second engaging portion of the frame, when the operating portion is disengaged from the second engaging portion, the rotating portion is capable of eccentrically rotating with the pivot as the rotation axis to drive the shaft portion and the securing portion to move toward a direction away from the first engaging portion, so that the securing portion disengages from the first engaging portion and compresses the elastic member, whereby the rotation portion is capable of rotating with the shaft portion as the rotation axis to drive the securing portion connected with the shaft portion to rotate to release the expansion cards; and a plurality of securing slots provided between the first engaging portion and the second engaging portion, and the expansion cards are secured at the securing slots, respectively.

11. The housing according to claim 10, further comprising a plurality of expansion slots, the positions of the expansion slots are corresponding to the positions of the securing slots, the expansion cards are respectively inserted in the expansion slots, when the securing portion is engaged with the first engaging portion, the securing portion securing one end of each of the expansion cards at the securing slot corresponding to the expansion slot.

12. The housing according to claim 10, wherein the securing portion has a plurality of elastic arms, the positions of the elastic arms correspond to the positions of the securing slots, and each of the elastic arms includes a projection, when the securing portion is engaged with the first engaging portion, the projection makes the corresponding expansion card generate preload interference.

13. The housing according to claim 10, wherein the rotating portion and the operating portion are L-shaped.

14. The housing according to claim 10, wherein the rotating portion has a pushing surface and an abutment surface, when the operating portion is engaged with the second engaging portion, the abutment surface abuts the frame, when the operating portion is disengaged from the second engaging portion, the abutment surface moves away from the frame, so that the pushing surface pushes the frame, whereby the rotating portion is capable of eccentrically rotating with the pivot as the rotation axis to drive the shaft portion and the securing portion to move toward a direction away from the first engaging portion.

15. The housing according to claim 14, wherein the distance between the pushing surface and pivot is greater than the distance between the abutment surface and the pivot.

16. The housing according to claim 15, wherein the rotating portion has a slant surface, the slant surface is connected with the pushing surface and the abutment surface, when the operating portion is engaged with the second engaging portion, the abutment surface abuts the frame, when the operating portion is disengaged from the second engaging portion and the rotating portion eccentrically rotates with the pivot as the rotation axis, the abutment surface, the slant surface and the pushing surface abuts the frame in sequence, so that the operating portion disengages from the second engaging portion.

17. The housing according to claim 15, wherein the rotating portion has an accommodation slot, and the accommodation slot accommodates a portion of the salient portion closer to the second engaging portion, suitable for the pivot to be pivotally connected with the rotation portion and the portion of the salient portion closer to the second engaging portion within the accommodation slot.

18. The housing according to claim 15, wherein when the operating portion moves toward the direction of approaching the second engaging portion, the rotating portion is capable of eccentrically rotating with the pivot as the rotation axis to drive the shaft portion and the securing portion to move toward a direction approaching the first engaging portion and the elastic member to be released to generate a restoring force, so that the securing portion engages at the first engaging portion to secure the expansion cards, and the operating portion engages at the second engaging portion.

19. The housing according to claim 10, wherein the operating member and the elastic member are respectively located at two opposite sides of the side wall having the second engaging portion of the frame.

* * * * *